(12) United States Patent
Yagishita

(10) Patent No.: US 7,064,024 B2
(45) Date of Patent: Jun. 20, 2006

(54) SEMICONDUCTOR DEVICE AND METHOD OF FABRICATING THE SAME

(75) Inventor: Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/135,334

(22) Filed: May 24, 2005

(65) Prior Publication Data

US 2006/0099749 A1    May 11, 2006

(30) Foreign Application Priority Data

Nov. 5, 2004    (JP) ............................... 2004-322206

(51) Int. Cl.
H01L 21/338    (2006.01)

(52) U.S. Cl. .................................................... 438/183

(58) Field of Classification Search ................ 438/135, 438/197, 259; 257/270, 182, 585
See application file for complete search history.

(56) References Cited

U.S. PATENT DOCUMENTS

2003/0111686 A1*    6/2003    Nowak ........................ 257/328

OTHER PUBLICATIONS

Choi, Y. K. et al., "A Spacer Patterning Technology for Nanoscale CMOS," IEEE Transactions on Electron Devices, vol. 49, No. 3, pp. 436-441, (Mar. 2002).

* cited by examiner

*Primary Examiner*—W. David Coleman
*Assistant Examiner*—Jarrett Stark
(74) *Attorney, Agent, or Firm*—Finnegan, Henderson, Farabow, Garrett & Dunner, L.L.P.

(57) ABSTRACT

According to the present invention, there is provided a semiconductor device having:
  first and second fins formed on a semiconductor substrate to oppose each other, and made of a semiconductor layer;
  an active region which is formed on the semiconductor substrate so as to be connected to the first and second fins, and supplies a predetermined voltage to the first and second fins; and
  a gate electrode formed on an insulating film formed on the semiconductor substrate, in a position separated from the active region by a predetermined spacing, so as to cross the first and second fins,
wherein in the active region, a predetermined portion between a first portion connected to the first fin and a second portion connected to the second fin is removed.

12 Claims, 12 Drawing Sheets

SEMICONDUCTOR DEVICE AND METHOD OF FABRICATING THE SAME

CROSS REFERENCE TO RELATED APPLICATION

This application is based upon and claims benefit of priority under 35 USC §119 from the Japanese Patent Application No. 2004-322206, filed on Nov. 5, 2004, the entire contents of which are incorporated herein by reference.

BACKGROUND OF THE INVENTION

The present invention relates to a semiconductor device and a method of fabricating the same.

One proposed semiconductor device has a structure in which a projecting semiconductor region is formed to be perpendicular to a gate electrode, a source and drain are formed on the two sides of the gate electrode in this semiconductor region, and voltage supply active regions for supplying voltages are connected to the source and drain.

When this semiconductor device is fabricated by the conventional method, a dummy pattern made of, e.g., amorphous silicon is formed on a silicon nitride film on a semiconductor substrate, and a narrow sidewall pattern for forming fins is formed on the side surfaces of the dummy pattern. After that, a resist pattern which is wider than the sidewall pattern and used to form voltage supply active regions is formed, and island-like fins and active regions are formed by using these sidewall pattern and resist pattern.

When the substrate surface is etched, however, an antireflective coating (to be referred to as an ARC hereinafter) remains on the side surfaces of the sidewall pattern. This increases the width of the fin, and makes micropatterning difficult.

A reference disclosing a method of fabricating the conventional semiconductor device having a fin-like shape is as follows.

Yang-kyu Choi, et al., "A Spacer Patterning Technology for Nanoscale CMOS", IEEE Transactions on Electron Devices, Vol. 49, No. 3, March 2002, pp. 436–441.

SUMMARY OF THE INVENTION

According to one aspect of the invention, there is provided a semiconductor device fabrication method, comprising:

forming a first insulating film on a semiconductor substrate;

forming a trench extending from a surface of the first insulating film to a predetermined depth of the semiconductor substrate;

depositing a second insulating film to fill the trench, and planarizing the second insulating film to form a fin formation dummy pattern;

forming a mask having a pattern corresponding to a predetermined active region on the first insulating film and fin formation dummy pattern;

patterning the first insulating film into a shape corresponding to the active region and exposing an upper portion of the fin formation dummy pattern in a region except for the active region by etching using the mask, and removing the mask;

depositing a third insulating film on surfaces of the fin formation dummy pattern, semiconductor substrate, and first insulating film, and etching back the third insulating film to form fin formation sidewall patterns on side surfaces of the fin formation dummy pattern and on side surfaces of the first insulating film;

etching the semiconductor substrate by using the fin formation sidewall patterns as masks, thereby forming first and second fins which oppose each other;

removing the fin formation dummy pattern;

forming a fourth insulating film for device isolation in a region where the first and second fins and first insulating film are not formed; and selectively forming an electrode which crosses the first and second fins.

According to one aspect of the invention, there is provided a semiconductor device fabrication method, comprising:

forming a first insulating film on an SOI substrate;

forming a trench extending from a surface of the first insulating film to a bottom of a semiconductor layer in the SOI substrate;

depositing a second insulating film to fill the trench, and planarizing the second insulating film to form a fin formation dummy pattern;

forming a mask having a pattern corresponding to a predetermined active region on the first insulating film and fin formation dummy pattern;

patterning the first insulating film into a shape corresponding to the active region and exposing an upper portion of the fin formation dummy pattern in a region except for the active region by etching using the mask, and removing the mask;

depositing a third insulating film on surfaces of the fin formation dummy pattern, semiconductor layer, and first insulating film, and etching back the third insulating film to form fin formation sidewall patterns on side surfaces of the fin formation dummy pattern and on side surfaces of the first insulating film;

etching the semiconductor layer by using the fin formation sidewall patterns as masks, thereby forming first and second fins which oppose each other; and selectively forming an electrode which crosses the first and second fins.

According to one aspect of the invention, there is provided a semiconductor device fabrication method, comprising:

forming a gate insulating film and gate electrode material in order on a semiconductor substrate;

forming a first insulating film on the gate electrode material;

forming a trench extending from a surface of the first insulating film to a bottom of the gate electrode material;

depositing a second insulating film to fill the trench, and planarizing the second insulating film to form a first gate electrode formation dummy pattern;

forming a mask having a pattern corresponding to a second gate electrode wider than a first gate electrode on the first insulating film and first gate electrode formation dummy pattern;

patterning the first insulating film into a shape corresponding to the second gate electrode and exposing an upper portion of the first gate electrode formation dummy pattern in a region except for the second gate electrode by etching using the mask, and removing the mask;

depositing a third insulating film on surfaces of the first gate electrode formation dummy pattern, gate electrode, and first insulating film, and etching back the third insulating film to form first gate electrode formation sidewall patterns on side surfaces of the first gate electrode formation dummy pattern and on side surfaces of the first insulating film; and etching the gate electrode material by using the first gate electrode formation sidewall patterns as masks, thereby forming two gate electrodes which oppose each other.

According to one aspect of the invention, there is provided a semiconductor device comprising:

first and second fins formed on a semiconductor substrate to oppose each other, and made of a semiconductor layer;

an active region which is formed on said semiconductor substrate so as to be connected to said first and second fins, and supplies a predetermined voltage to said first and second fins; and a gate electrode formed on an insulating film formed on said semiconductor substrate, in a position separated from said active region by a predetermined spacing, so as to cross said first and second fins, wherein in said active region, a predetermined portion between a first portion connected to said first fin and a second portion connected to said second fin is removed.

According to one aspect of the invention, there is provided a semiconductor device comprising:

first and second fins formed on an oxide film of an SOI substrate to oppose each other, and made of a semiconductor layer of said SOI substrate;

an active region made of said semiconductor layer, which is formed on said oxide film so as to be connected to said first and second fins, and supplies a predetermined voltage to said first and second fins;

a first insulating film buried between said first and second fins; and a gate electrode formed on said oxide film, in a position separated from said active region by a predetermined spacing, so as to cross said first and second fins, wherein in said active region, a predetermined portion between a first portion connected to said first fin and a second portion connected to said second fin is removed.

According to one aspect of the invention, there is provided a semiconductor device comprising:

first and second gate electrodes formed to oppose each other on an oxide film formed on a semiconductor substrate, and made of an electrode material; and a electrode region wider than the first and second gate electrodes made of said electrode material, which is formed on said oxide film so as to be connected to said first and second gate electrodes, and supplies a predetermined voltage to said first and second gate electrodes, wherein in said wide electrode region, a predetermined portion between a first portion connected to said first gate electrode and a second portion connected to said second gate electrode is removed.

DETAILED DESCRIPTION OF THE INVENTION

Embodiments of the present invention will be described below with reference to the accompanying drawings.

(1) FIRST EMBODIMENT

FIGS. 1 to 8 illustrate the structure of a semiconductor device according to the first embodiment, and the sections of elements in different steps of a method of fabricating the device.

Figure 1:
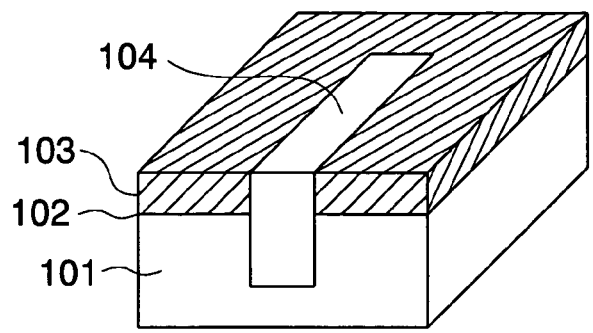
FIG. 1 is a longitudinal sectional view of elements showing a step of a method of fabricating a semiconductor device according to the first embodiment of the present invention.

As shown in FIG. 1, a semiconductor substrate 101 is prepared.

A silicon oxide film 102 about 5 nm thick is formed on the surface of the semiconductor substrate 101. A silicon nitride film 103 about 100 nm thick is deposited on the silicon oxide film 102.

The silicon nitride film 103 is coated with a resist film (not shown), and lithography using a light source such as KrF or ArF and reactive ion etching (to be referred to as RIE hereinafter) are performed, thereby forming a trench 104 for burying a dummy pattern. The trench 104 extends through the silicon nitride film 103, and reaches a depth of about, e.g., 100 nm from the surface of the semiconductor substrate 101.

A silicon oxide film is deposited on the entire surface so as to be buried in the trench 104 by TEOS•CVD or high-density plasma (to be referred to as HDP hereinafter) CVD, and then planarized by CMP, thereby forming a dummy pattern 104.

Figure 2:
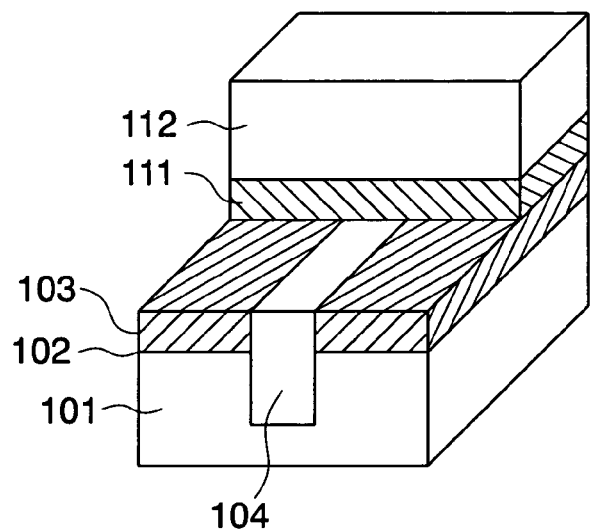
FIG. 2 is a longitudinal sectional view of elements showing a step of the method of fabricating the semiconductor device according to the first embodiment.

As shown in FIG. 2, an anti-reflective coating (to be referred to as an ARC hereinafter) 111 is formed on the surfaces of the planarized silicon nitride film 103 and dummy pattern 104. A resist film 112 is formed on the ARC 111 to form a bottom ARC type resist pattern 112.

The ARC film 111 is formed in order to use photolithography capable of processing faster than that when an electron beam is used, and to realize fine patterns.

Figure 3:
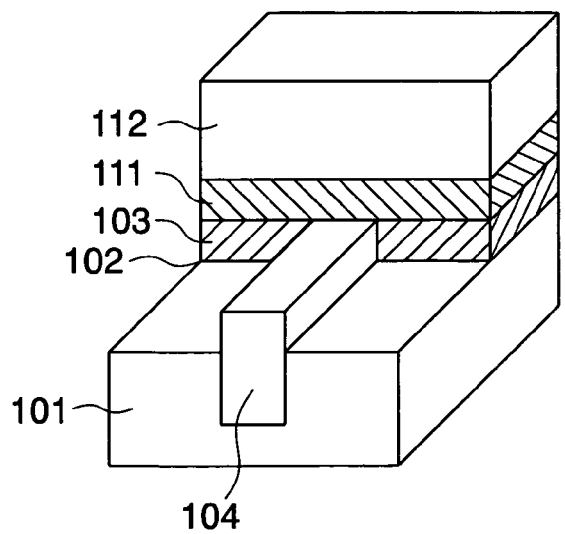
FIG. 3 is a longitudinal sectional view of elements showing a step of the method of fabricating the semiconductor device according to the first embodiment.

As shown in FIG. 3, the resist pattern 112 is used as a mask to etch the silicon nitride film 103. As a consequence, the upper portion of the dummy pattern 104 is exposed into a projecting shape.

Figure 4:
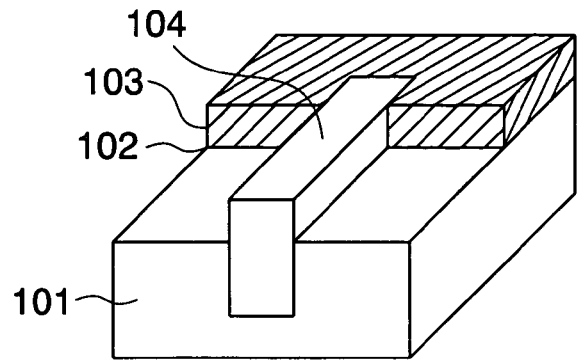
FIG. 4 is a longitudinal sectional view of elements showing a step of the method of fabricating the semiconductor device according to the first embodiment.

As shown in FIG. 4, the resist pattern 112 and ARC film 111 are removed.

If it is necessary to prevent the pattern of the silicon nitride film 103 from being widened by sidewall patterns to be formed later, it is desirable to narrow the silicon nitride film 103 by wet etching using hot phosphoric acid.

Figure 5:
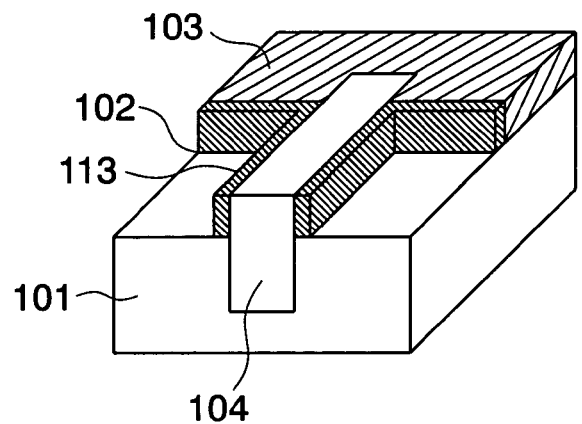
FIG. 5 is a longitudinal sectional view of elements showing a step of the method of fabricating the semiconductor device according to the first embodiment.

As shown in FIG. 5, a silicon nitride film about 20 nm thick is deposited on the entire surface, and etched back by non-masking RIE. In this manner, sidewall patterns 113 made of the silicon nitride film are formed on the side surfaces of the dummy pattern 104 and on the side surfaces of the silicon nitride film 103.

Figure 6:
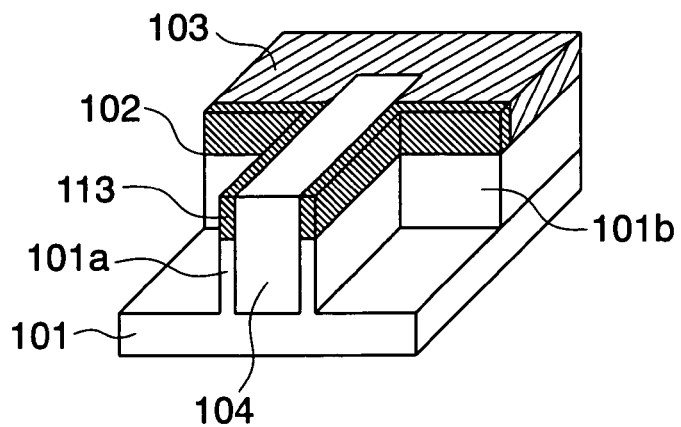
FIG. 6 is a longitudinal sectional view of elements showing a step of the method of fabricating the semiconductor device according to the first embodiment.

As shown in FIG. 6, the silicon nitride film 103, sidewall patterns 113, and dummy pattern 104 are used as masks to perform RIE to a depth of about 100 nm of the semiconductor substrate 101. In this way, island-like fins 101a are formed in the lower portions of the two side surfaces of the dummy pattern 104, and a voltage supply active region 101b is formed in the lower portion of the silicon nitride film 103.

Figure 7:
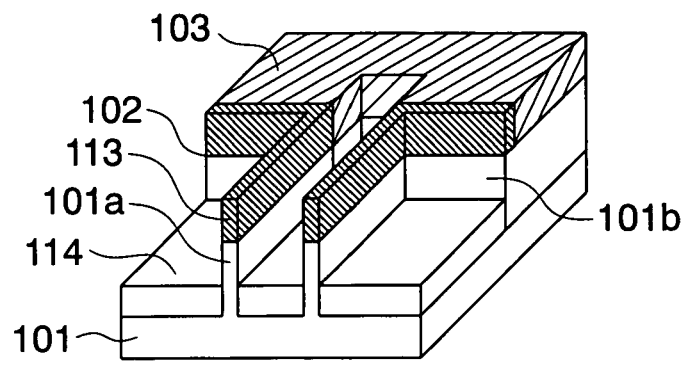
FIG. 7 is a longitudinal sectional view of elements showing a step of the method of fabricating the semiconductor device according to the first embodiment.

As shown in FIG. 7, the dummy pattern 104 is removed by etching using, e.g., HF.

After that, for the purpose of device isolation, a silicon oxide film 114 is deposited on the entire surface by HDP•CVD, and planarized by CVD. In addition, etch back is performed by RIE to leave the silicon oxide film 114 behind on the bottom surface of the trench by a thickness of about 40 nm. As a consequence, fins 101a about 60 nm thick are formed.

After that, a gate oxide film 131 made of a silicon oxynitride film or the like (for example, $H_fO_2$, $ZrO_2$, HfSiON) is formed on the side surfaces of the fins 101a by thermal oxidation and nitriding or the like.

Figure 8:
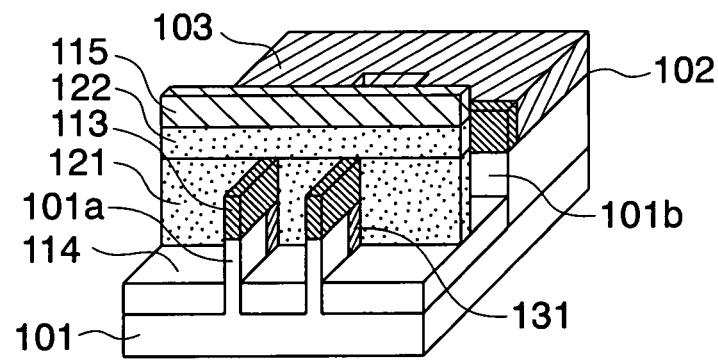
FIG. 8 is a longitudinal sectional view of elements showing a step of the method of fabricating the semiconductor device according to the first embodiment.

As shown in FIG. 8, a first polysilicon film 121 about 300 nm thick is deposited as a gate electrode material on the entire surface, and planarized by CMP.

In addition, a second polysilicon film 122 about 50 nm thick is deposited, and a silicon nitride film 115 about 100 nm thick is deposited on the surface of the second polysilicon film 122.

The silicon nitride film 115 is coated with a resist film (not shown), and this resist film is patterned into the shape of a gate electrode. The patterned resist film is used as a mask to pattern the silicon nitride film 115.

Furthermore, the silicon nitride film 115 thus patterned is used as a mask to pattern the first and second polysilicon films 121 and 122 by RIE. Consequently, a gate electrode made of the first and second polysilicon films 121 and 122 is formed. The subsequent steps are the same as the conventional LSI fabrication steps, so an explanation thereof will be omitted.

A method of fabricating a semiconductor device according to a comparative example will be explained below with reference to FIGS. 9 to 18.

Figure 9:
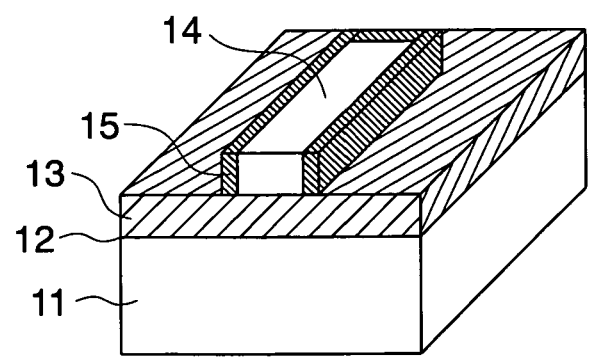
FIG. 9 is a longitudinal sectional view of elements showing a step of a method of fabricating a semiconductor device according to a comparative example.

As shown in FIG. 9, a silicon oxide film 12 about 5 nm thick is formed on a semiconductor substrate 11 by thermal oxidation or the like, and a silicon nitride film 13 about 100 nm thick is deposited. On the silicon nitride film 13, an amorphous silicon film, for example, for dummy pattern formation is deposited by a thickness of about 150 nm.

This amorphous silicon film is coated with a resist, and lithography is used to form a resist pattern about 0.1 μm wide. The obtained resist pattern is used as a mask to etch the amorphous silicon by RIE, thereby forming a dummy pattern 14.

A TEOS film about 40 nm thick is deposited on the surfaces of the dummy pattern 14 and silicon nitride film 13. Then, the TEOS film is processed by non-masking RIE to leave TEOS sidewalls 15 behind on the side surfaces of the dummy pattern 14.

Figure 10:
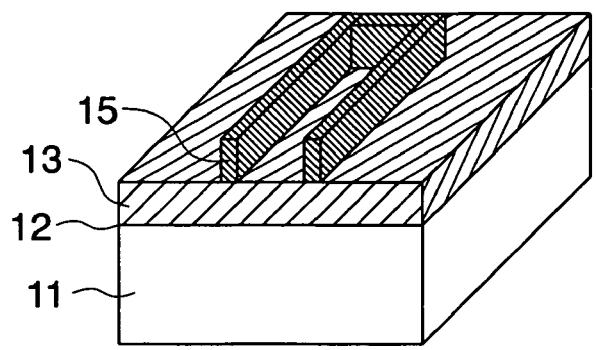
FIG. 10 is a longitudinal sectional view of elements showing a step of a method of fabricating a semiconductor device according to the comparative example.

As shown in FIG. 10, the dummy pattern 14 is etched away by using a liquid chemical or the like, thereby leaving a pattern mask made of the TEOS sidewalls 15 behind on the silicon nitride film 13.

Figure 11:
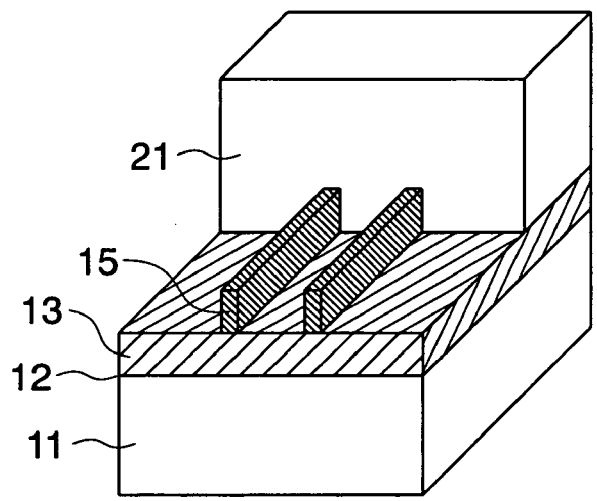
FIG. 11 is a longitudinal sectional view of elements showing a step of a method of fabricating a semiconductor device according to the comparative example.

As shown in FIG. 11, the silicon nitride film 13 and TEOS sidewalls 15 are coated with a resist, and the conventional lithography technique is used to form a patterned resist film 21.

Figure 12:
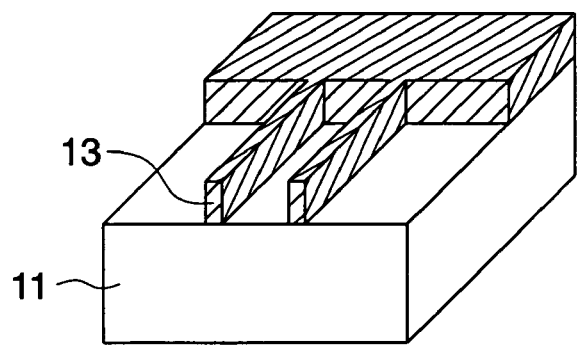
FIG. 12 is a longitudinal sectional view of elements showing a step of a method of fabricating a semiconductor device according to the comparative example.

As shown in FIG. 12, both the pattern made of the TEOS sidewalls 15 and the pattern made of the resist film 21 are used as masks to process the silicon nitride film 13 by RIE.

After that, the TEOS sidewalls 15 and resist film 21 are removed.

Figure 13:
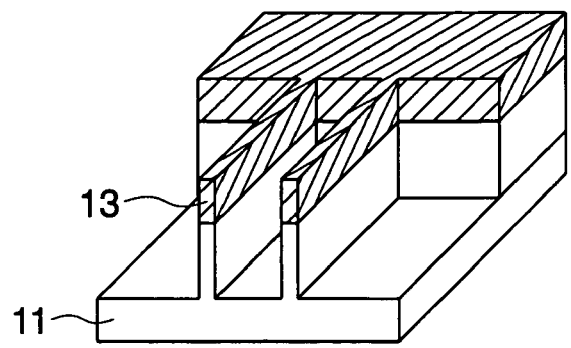
FIG. 13 is a longitudinal sectional view of elements showing a step of a method of fabricating a semiconductor device according to the comparative example.

As shown in FIG. 13, the silicon nitride film 13 is used as a mask to remove the semiconductor substrate 11 to a depth of about 80 nm by RIE.

Figure 14:
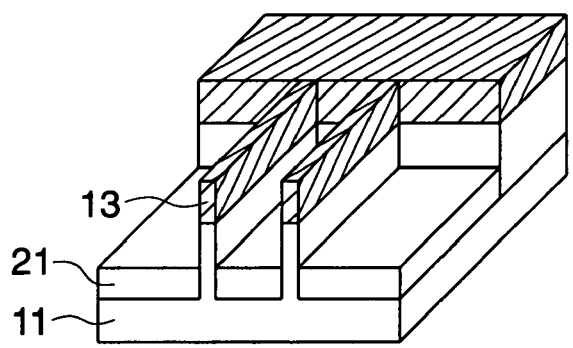
FIG. 14 is a longitudinal sectional view of elements showing a step of a method of fabricating a semiconductor device according to the comparative example.

As shown in FIG. 14, a silicon oxide film 21 for device isolation is deposited on the entire surface by HDP•CVD or the like, and planarized by CMP. The silicon oxide film 21 is then etched back by non-masking RIE, and left behind on the bottom surface of the trench by a thickness of about 40 nm.

A gate oxide film (not shown) made of a silicon nitride film or the like is formed on the side surfaces of fins.

Figure 15:
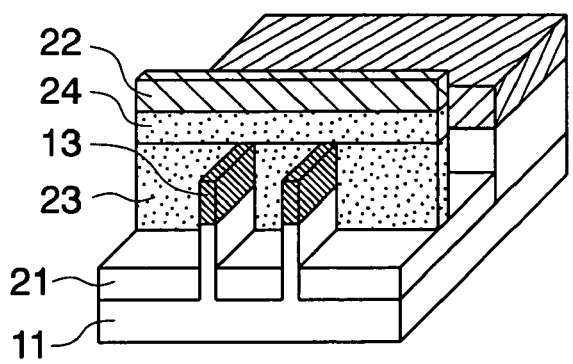
FIG. 15 is a longitudinal sectional view of elements showing a step of a method of fabricating a semiconductor device according to the comparative example.

As shown in FIG. 15, a first polysilicon film 23 about 300 nm thick is deposited as a gate electrode material on the entire surface, and planarized by CMP. After that, a second polysilicon film 24 about 50 nm thick is deposited on the entire surface. In addition, a silicon nitride film 22 about 100 nm thick is deposited on the entire surface.

The silicon nitride film 22 is coated with a resist to form a resist film (not shown) having a gate electrode shape. This resist film is used as a mask to etch the silicon nitride film 22, and a pattern made of the obtained silicon nitride film 22 is used as a mask to process the first and second polysilicon films 23 and 24 by RIE. In this manner, a gate electrode made of the first and second polysilicon films 23 and 24 is formed.

Figure 16:
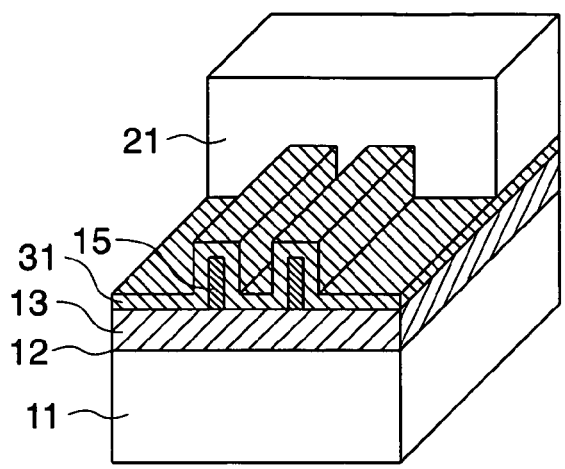
FIG. 16 is a longitudinal sectional view of elements showing a step of a method of fabricating a semiconductor device according to the comparative example.
Figure 17:
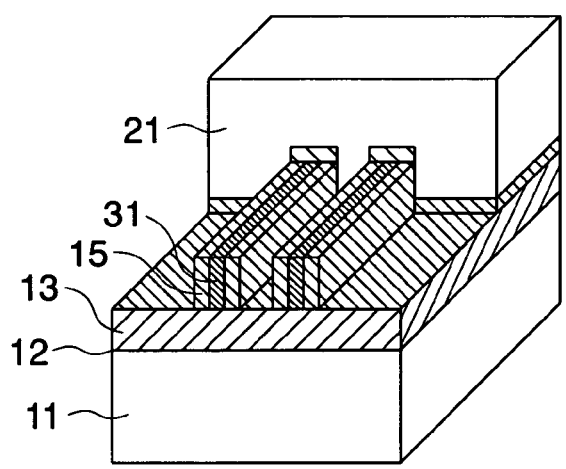
FIG. 17 is a longitudinal sectional view of elements showing a step of a method of fabricating a semiconductor device according to the comparative example.
Figure 18:
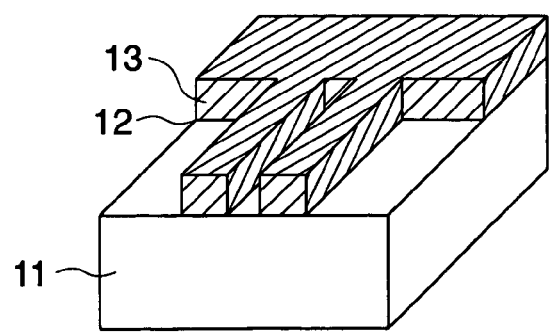
FIG. 18 is a longitudinal sectional view of elements showing a step of a method of fabricating a semiconductor device according to the comparative example.

As shown in FIG. 16, if a bottom ARC type resist film is used after the step shown in FIG. 10, an ARC film 31 is also formed after development in a region where no resist film 21 is formed. When the ARC film 31 is etched, as shown in FIG. 17, the ARC remains on the side surfaces of the TEOS sidewalls 15. Consequently, as shown in FIG. 18, the width of the line pattern made of the micropatterned TEOS sidewalls 15 is increased by the remaining ARC.

Also, in this fabrication method according to the comparative example, in the steps shown in FIGS. 12 to 15, portions of the semiconductor substrate on the two sides of the narrow fins are simultaneously etched away in the same process. Since the mechanical strength of the fins is insufficient, the fins may fall or may be disconnected depending on the dimensions.

By contrast, in the first embodiment described above, when the ARC film 111 is formed in the step shown in FIG. 2, the conventional problem that the ARC remains on the side surfaces of the sidewall patterns can be solved because the undercoating of the ARC film 111 is flat.

It is also possible to realize both the micropatterned sidewall patterns 113 for fin formation, and the common bottom ARC type resist pattern 112 for forming the voltage supply active region.

That is, the film deposition and etch back steps for forming the sidewall patterns 113 are performed after the step of forming the common resist pattern 112. Accordingly, the lithography step for forming the common resist pattern 112 can be executed on the flat undercoating, so the two patterns can be realized.

In this embodiment of the present invention, it is also possible to form the fins 101a having a fine width which is smaller than the limit of lithography, and reduce the line edge roughness.

That is, when fins are formed by lithography, they cannot be formed by a width smaller than the limit of lithography. In addition, the side surfaces of the fins are roughened by variations in width. This not only worsens the line edge roughness but also causes disconnection in some cases.

By contrast, in the step shown in FIG. 5 of the first embodiment, a silicon nitride film is deposited to cover the dummy pattern having the exposed upper portion, and sidewalls are formed on the side surfaces of the dummy pattern by etch back. The width of the sidewalls is determined by the thickness of the deposited silicon nitride film, so no such variations as caused by lithography are produced. Therefore, fins can be formed by a width smaller than the limit of lithography while the line edge roughness is reduced.

Also, in the formation of narrow fins, if semiconductor layers inside and outside these fins are simultaneously etched away as in the comparative example, these fins may fall or may be disconnected. The first embodiment solves this problem by removing the two sides of the fins in different steps.

That is, in the step shown in FIG. 1, the inside of the two fins are etched away by forming the dummy pattern 104. In the step shown in FIG. 3, the silicon nitride film 103 present outside the dummy pattern 104 is removed to expose the upper portion of the dummy pattern 104. Then, in the step shown in FIG. 5, the sidewall patterns 113 are formed on the side surfaces of the dummy pattern 104. In the step shown in FIG. 6, the outsides of the fins are etched away. As described above, the step of removing the inside of the two fins shown in FIG. 1 is different from the step of removing the outsides of these fins shown in FIG. 6. Accordingly, destruction or the like of the fins can be prevented.

Figure 19:
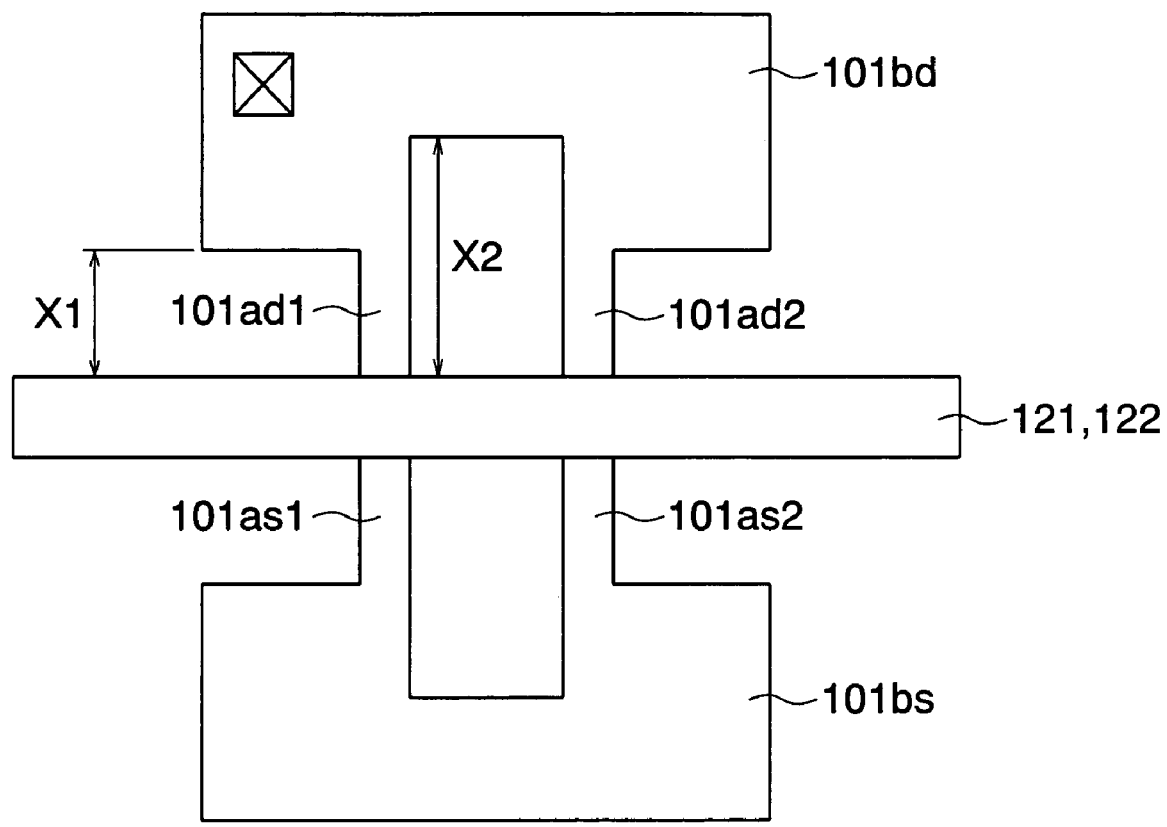
FIG. 19 is a plan view showing the arrangement of the semiconductor device according to the first embodiment.

FIG. 19 shows the planar arrangement of the semiconductor device according to the first embodiment. The two fins 101a are formed to be perpendicular to the gate electrode made of the first and second polysilicon films 121 and 122. Drain regions 101ad1 and 101ad2 and source regions 101as1 and 101as2 are formed on the two sides of the gate electrode. The drain regions 101ad1 and 101ad2 are connected to a drain voltage supply active region 101bd. The source regions 101as1 and 101as2 are connected to a source voltage supply active region 101bs.

In the first embodiment, a portion where the dummy pattern 104 is present is removed from a central portion of each of the drain voltage supply active region 101bd and source potential supply active region 101bs. Therefore, a distance X2 from this portion of the drain voltage supply active region 101bd or source voltage supply active region 101bs to the gate electrode is longer than a distance X1 from two end portions, except for the central portion, of the drain voltage supply active region 101bd or source voltage supply active region 101bs to the gate electrode.

This makes it possible to reduce the parasitic capacitance between the gate electrode and the drain voltage supply active region 101bd or source voltage supply active region 101bs, and increase the operating speed of the device.

(2) SECOND EMBODIMENT

A method of fabricating a semiconductor device according to the second embodiment of the present invention will be described below with reference to FIGS. 20 to 26. The second embodiment differs from the first embodiment in that an SOI substrate is used.

Figure 20:
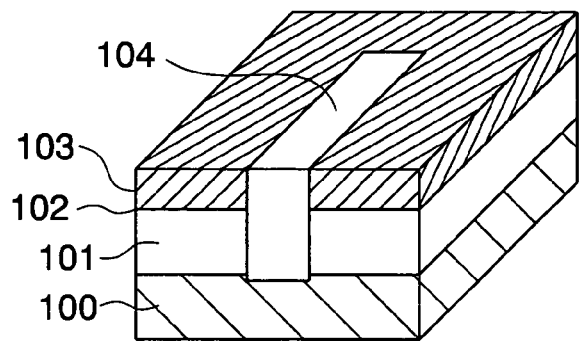
FIG. 20 is a longitudinal sectional view of elements showing a step of a method of fabricating a semiconductor device according to the second embodiment of the present invention.

As shown in FIG. 20, a BOX silicon oxide film 100 is formed on a semiconductor substrate (not shown), and a semiconductor layer 101 about, e.g., 100 nm is formed on the BOX silicon oxide film 100, thereby preparing an SOI substrate.

A silicon oxide film 102 about 5 nm thick is formed on the semiconductor layer 101, and a silicon nitride film 103 about 100 nm thick is deposited on the silicon oxide film 102.

A resist film (not shown) is formed on the silicon nitride film 103, and used as a mask to etch the silicon nitride film 103, silicon oxide film 102, and semiconductor layer 101 by RIE, thereby forming a trench about 205 nm deep for burying a dummy pattern. In this state, the depth of the silicon nitride film 103 is about 100 nm, the depth of the silicon oxide film 102 is about 5 nm, and the depth of the semiconductor layer 101 is about 100 nm.

A TEOS film or a silicon oxide film obtained by HDP•CVD is deposited on the entire surface and planarized by CMP, thereby burying a dummy pattern material in the trench to form a dummy pattern 104.

Figure 21:
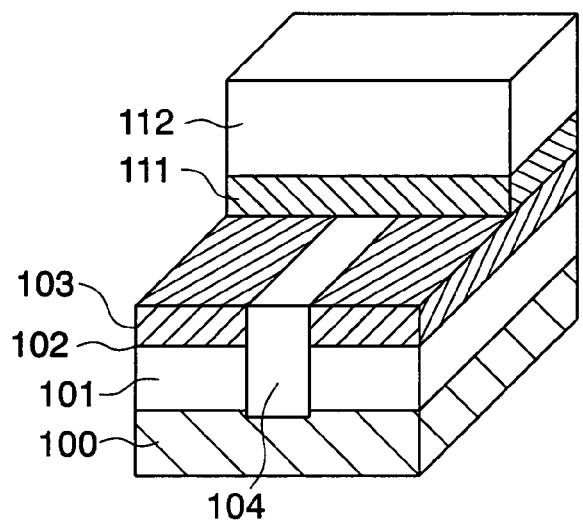
FIG. 21 is a longitudinal sectional view of elements showing a step of the method of fabricating the semiconductor device according to the second embodiment.

As shown in FIG. 21, an ARC film 111 is formed on the planarized silicon nitride film 103 and on the dummy pattern 104, and coated with a resist. Lithography and RIE of the ARC are then performed to form a bottom ARC type resist film 112 having a pattern corresponding to voltage supply active regions.

Figure 22:
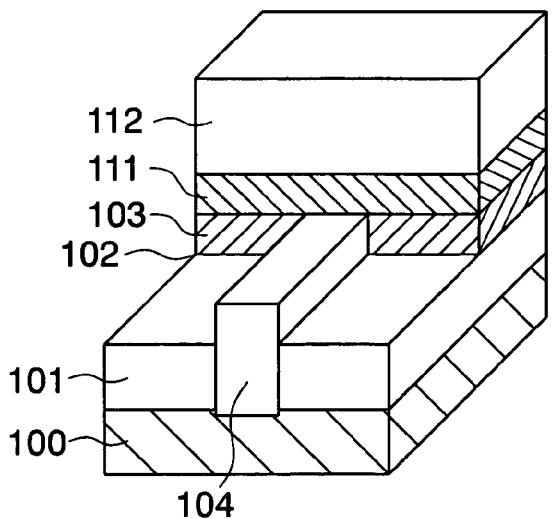
FIG. 22 is a longitudinal sectional view of elements showing a step of the method of fabricating the semiconductor device according to the second embodiment.

As shown in FIG. 22 the resist film 112 is used as a mask to etch the silicon nitride film 103. As a consequence, the upper portion of the dummy pattern 104 is exposed into a projecting shape.

Figure 23:
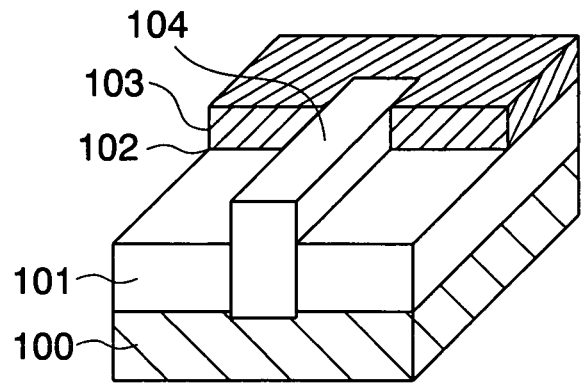
FIG. 23 is a longitudinal sectional view of elements showing a step of the method of fabricating the semiconductor device according to the second embodiment.

As shown in FIG. 23, the resist film 112 and ARC film 111 are removed. If it is necessary to avoid the pattern of the silicon nitride film 103 from being widened by the presence of sidewall patterns 113, the silicon nitride film 103 patterned in accordance with voltage supply active regions is desirably narrowed in advance by wet etching using hot phosphoric acid.

Figure 24:
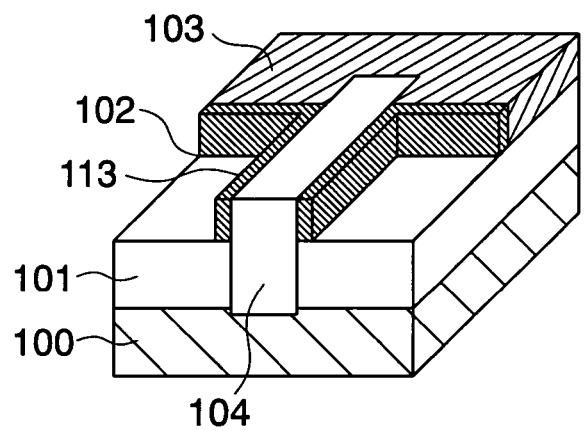
FIG. 24 is a longitudinal sectional view of elements showing a step of the method of fabricating the semiconductor device according to the second embodiment.

A silicon nitride film about 20 nm thick is deposited on the entire surface, and non-masking RIE is performed. Consequently, as shown in FIG. 24, sidewall patterns 113 made of the silicon nitride film are formed on the side surfaces of the dummy pattern 104 and on the side surfaces of the silicon nitride film 103 having the pattern of voltage supply active regions.

Figure 25:
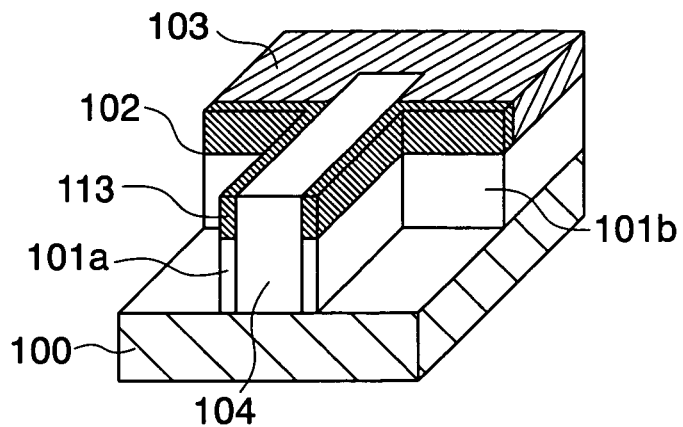
FIG. 25 is a longitudinal sectional view of elements showing a step of the method of fabricating the semiconductor device according to the second embodiment.

As shown in FIG. 25, the silicon nitride film 103, the sidewall patterns 113 made of the silicon nitride film, and the dummy pattern 104 are used as masks to etch the semiconductor layer 101 to its bottom surface by RIE. In this manner, fins 101a made of the semiconductor layer 101 are formed on the two side surfaces of the dummy pattern 104, and a voltage supply active region 101b is formed in the lower portion of the silicon nitride film 103.

After that, a gate oxide film (not shown) made of a silicon oxynitride film or the like is formed on the side surfaces of the fins 101a. A first polysilicon film 121 about 300 nm thick is deposited as a gate electrode material on the entire surface, and planarized by CMP. Then, a second polysilicon film 122 about 50 nm thick is deposited, and a silicon nitride film 115 about 100 nm thick is deposited on the entire surface.

Figure 26:
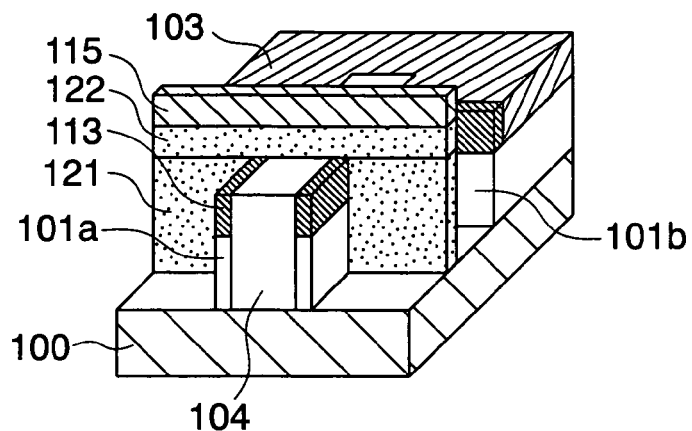
FIG. 26 is a longitudinal sectional view of elements showing a step of the method of fabricating the semiconductor device according to the second embodiment.

As shown in FIG. 26, a resist film (not shown) having a gate electrode pattern is formed on the silicon nitride film 115, and used as a mask to process the silicon nitride film 115.

Furthermore, the silicon nitride film 115 is used as a mask to process the first and second polysilicon films 121 and 122 by RIE. In this manner, a gate electrode made of the first and second polysilicon films 121 and 122 is formed.

The subsequent steps are the same as the conventional LSI fabrication steps, so an explanation thereof will be omitted.

As in the first embodiment described above, the second embodiment can solve the problem that the ARC remains on the side surfaces of the sidewall patterns.

Also, both the dummy pattern lithography step of forming the fins 101a and the lithography step of forming the voltage supply active region 101b can be performed on the flat undercoating. This makes fine pattern formation possible. Since the fins are formed by using the sidewalls as masks, the fins 101a narrower than the limit of lithography can be formed, and the line edge roughness can be reduced.

In addition, as in the first embodiment, the dummy pattern 104 extends to a central portion of the voltage supply active region 101b. Since this increases the distance from the gate electrode to this portion of the voltage supply active region 101b, the capacitance between the gate electrode and the voltage supply active region 101b can be reduced. As a consequence, the speed of the device operation can be increased.

Furthermore, since an SOI substrate is used in the second embodiment, no device isolation insulating film need to be deposited unlike in the first embodiment. In the step shown in FIG. 24, therefore, it is unnecessary to remove the dummy pattern 104 buried between the pair of fins 101a. Accordingly, the dummy pattern 104 supports the fins 101a and increases the structural strength of the fins 101a. This prevents a fall of the fins 101a. Consequently, thinner and higher fins can be formed because they are supported by the dummy pattern 104.

(3) THIRD EMBODIMENT

A method of fabricating a semiconductor device according to the third embodiment of the present invention will be described below with reference to FIGS. 27 to 32.

Each of the first and second embodiments described above is applied to a case in which fins made of a semiconductor layer serving as source, drain, and channel regions are formed by processing a semiconductor substrate. The third embodiment is applied to a case in which a gate electrode is formed by processing a polysilicon film.

Figure 27:
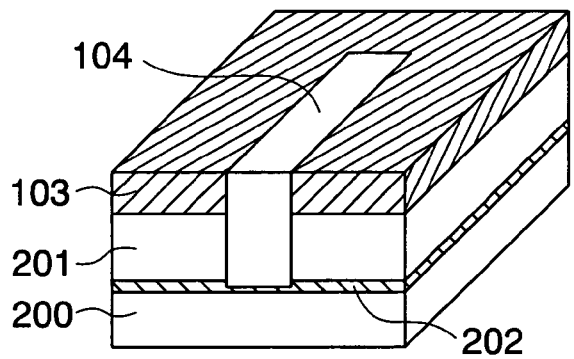
FIG. 27 is a longitudinal sectional view of elements showing a step of a method of fabricating a semiconductor device according to the third embodiment of the present invention.

As shown in FIG. 27, a gate oxide film 202 is formed on a semiconductor substrate 200. A polysilicon film 201 about 100 nm thick is formed on the gate oxide film 202. A silicon nitride film 103 about 100 nm thick is deposited on the polysilicon film 201.

A resist film (not shown) is formed on the silicon nitride film 103, and used as a mask to etch the silicon nitride film 103 and polysilicon film 201 by RIE, thereby forming a trench about 200 nm deep for burying a dummy pattern.

A TEOS film or a silicon oxide film obtained by HDP•CVD is deposited on the entire surface and planarized by CMP, thereby burying a dummy pattern material in the trench to form a dummy pattern 104.

Figure 28:
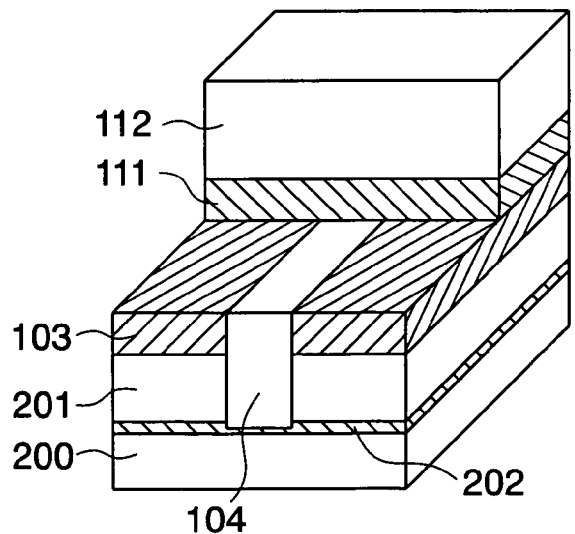
FIG. 28 is a longitudinal sectional view of elements showing a step of the method of fabricating the semiconductor device according to the third embodiment.

As shown in FIG. 28, an ARC film 111 is formed on the planarized silicon nitride film 103 and on the dummy pattern 104, and coated with a resist. Lithography and ARC-RIE are then performed to form a bottom ARC type resist film 112 having a pattern corresponding to a voltage supply active region.

Figure 29:
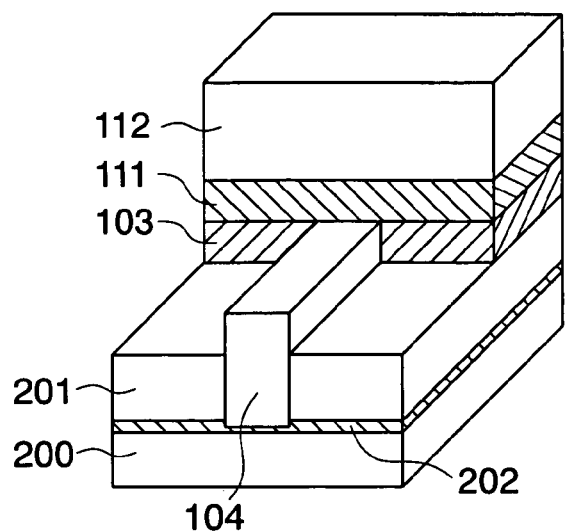
FIG. 29 is a longitudinal sectional view of elements showing a step of the method of fabricating the semiconductor device according to the third embodiment.

As shown in FIG. 29, the resist film 112 is used as a mask to etch the silicon nitride film 103. Consequently, the upper portion of the dummy pattern 104 is exposed into a projecting shape.

Figure 30:
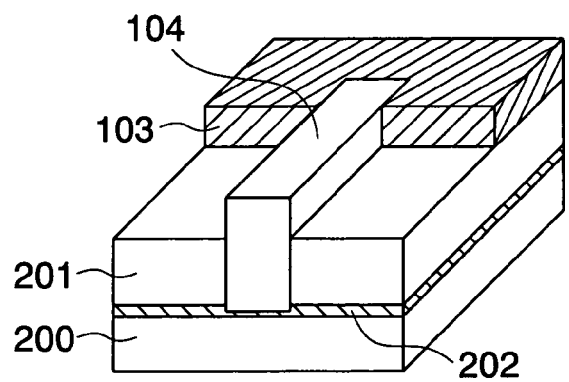
FIG. 30 is a longitudinal sectional view of elements showing a step of the method of fabricating the semiconductor device according to the third embodiment.

As shown in FIG. 30, the resist film 112 and ARC film 111 are removed. If it is necessary to avoid the pattern of the silicon nitride film 103 from being widened by the presence of sidewall patterns 113, the silicon nitride film 103 patterned in accordance with a voltage supply active region is desirably narrowed in advance by wet etching using hot phosphoric acid.

Figure 31:
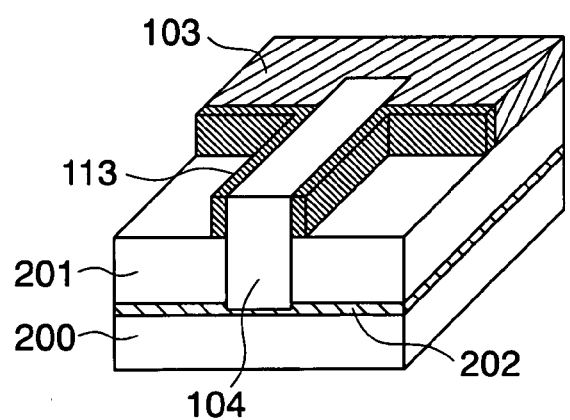
FIG. 31 is a longitudinal sectional view of elements showing a step of the method of fabricating the semiconductor device according to the third embodiment.

A silicon nitride film about 20 nm thick is deposited on the entire surface, and non-masking RIE is performed. Consequently, as shown in FIG. 31, sidewall patterns 113 made of the silicon nitride film are formed on the side surfaces of the dummy pattern 104 and on the side surfaces of the silicon nitride film 103 having the pattern of a voltage supply active region.

Figure 32:
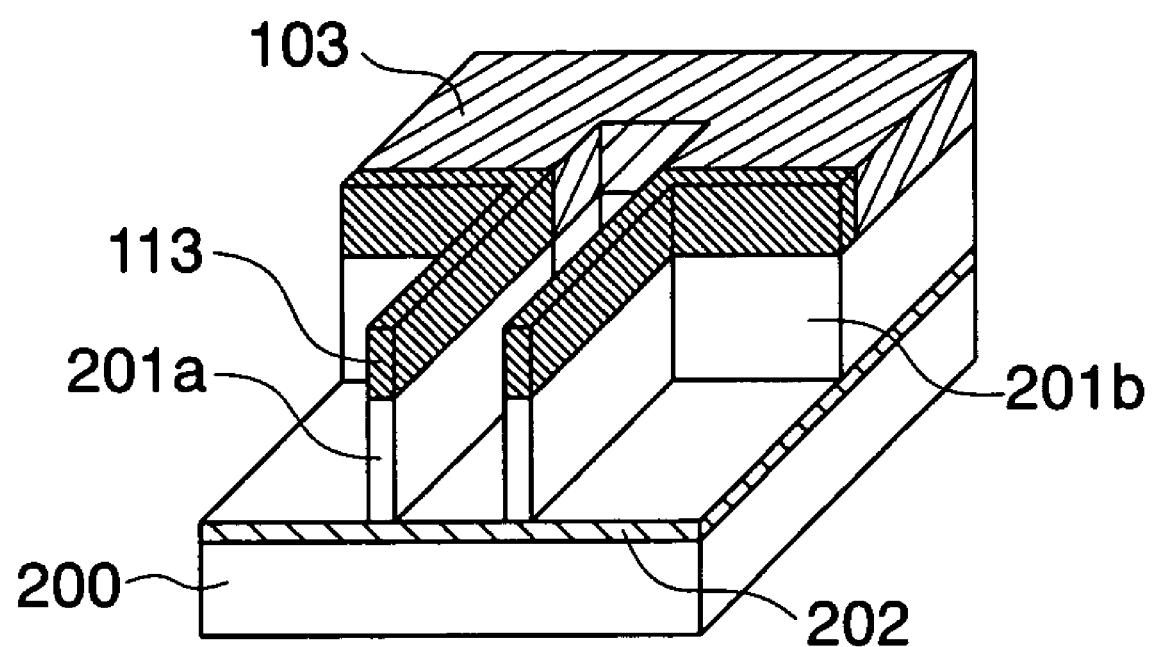
FIG. 32 is a longitudinal sectional view of elements showing a step of the method of fabricating the semiconductor device according to the third embodiment.

As shown in FIG. 32, the silicon nitride film 103, the sidewall patterns 113 made of the silicon nitride film, and the dummy pattern 104 are used as masks to etch the polysilicon film 201 to its bottom surface by RIE. In this manner, gate electrodes 201*a* made of the polysilicon film 201 are formed on the two side surfaces of the dummy pattern 104, and a voltage supply active region 201*b* for supplying a gate potential to these gate electrodes is formed in the lower portion of the silicon nitride film 103. The dummy pattern 104 is removed by a liquid chemical or RIE.

The subsequent steps are the same as the conventional LSI fabrication steps, so an explanation thereof will be omitted.

As in the first and second embodiments described above, the third embodiment can solve the problem that the ARC remains on the side surfaces of the sidewall patterns.

Also, both the lithography step of the dummy pattern 104 for forming the gate electrode 201*a* and the lithography step of forming the potential supply active region 201*b* can be performed on the flat undercoating. This makes fine pattern formation possible. Since the gates are formed by using the sidewalls as masks, the gate electrodes 201*a* narrower than the limit of lithography can be formed, and the line edge roughness can be reduced.

Each of the above embodiments is merely an example and does not limit the present invention. Therefore, these embodiments can be modified within the technical scope of the present invention. For example, the film materials, film formation methods, film thicknesses, trench depths, and the like described in the above embodiments can be freely changed.

What is claimed is:

1. A semiconductor device fabrication method, comprising:
   forming a first insulating film on a semiconductor substrate;
   forming a trench extending from a surface of the first insulating film to a predetermined depth of the semiconductor substrate;
   depositing a second insulating film to fill the trench, and planarizing the second insulating film to form a fin formation dummy pattern;
   forming a mask having a pattern corresponding to a predetermined active region on the first insulating film and fin formation dummy pattern;
   patterning the first insulating film into a shape corresponding to the active region and exposing an upper portion of the fin formation dummy pattern in a region except for the active region by etching using the mask, and removing the mask;
   depositing a third insulating film on surfaces of the fin formation dummy pattern, semiconductor substrate, and first insulating film, and etching back the third insulating film to form fin formation sidewall patterns on side surfaces of the fin formation dummy pattern and on side surfaces of the first insulating film;
   etching the semiconductor substrate by using the fin formation sidewall patterns as masks, thereby forming first and second fins which oppose each other;
   removing the fin formation dummy pattern;
   forming a fourth insulating film for device isolation in a region where the first and second fins and first insulating film are not formed; and
   selectively forming an electrode which crosses the first and second fins.

2. A method according to claim 1, wherein when the mask is formed, an anti-reflective film is formed on the surfaces of the first insulating film and fin formation dummy pattern, a mask material is formed on a surface of the anti-reflective film, and the anti-reflective film and mask material are patterned to have a pattern corresponding to the predetermined active region.

3. A method according to claim 1, wherein after the mask is removed and before the third insulating film is deposited, wet etching is performed on the first insulating film having a pattern corresponding to the active region, thereby decreasing a pattern width.

4. A method according to claim 1, wherein a silicon nitride film is used as the first insulating film, a silicon oxide film is used as the second insulating film, and a silicon nitride film is used as the third insulating film.

5. A semiconductor device fabrication method, comprising:
   forming a first insulating film on an SOI substrate;
   forming a trench extending from a surface of the first insulating film to a bottom of a semiconductor layer in the SOI substrate;
   depositing a second insulating film to fill the trench, and planarizing the second insulating film to form a fin formation dummy pattern;
   forming a mask having a pattern corresponding to a predetermined active region on the first insulating film and fin formation dummy pattern;
   patterning the first insulating film into a shape corresponding to the active region and exposing an upper portion of the fin formation dummy pattern in a region except for the active region by etching using the mask, and removing the mask;
   depositing a third insulating film on surfaces of the fin formation dummy pattern, semiconductor layer, and first insulating film, and etching back the third insulating film to form fin formation sidewall patterns on side surfaces of the fin formation dummy pattern and on side surfaces of the first insulating film;
   etching the semiconductor layer by using the fin formation sidewall patterns as masks, thereby forming first and second fins which oppose each other; and
   selectively forming an electrode which crosses the first and second fins.

6. A method according to claim 5, wherein when the mask is formed, an anti-reflective film is formed on the surfaces of the first insulating film and fin formation dummy pattern, a mask material is formed on a surface of the anti-reflective film, and the anti-reflective film and mask material are patterned to have a pattern corresponding to the predetermined active region.

7. A method according to claim 5, wherein after the mask is removed and before the third insulating film is deposited, wet etching is performed on the first insulating film having a pattern corresponding to the active region, thereby decreasing a pattern width.

8. A method according to claim 5, wherein a silicon nitride film is used as the first insulating film, a silicon oxide film is used as the second insulating film, and a silicon nitride film is used as the third insulating film.

9. A semiconductor device fabrication method, comprising:

forming a gate insulating film and gate electrode material in order on a semiconductor substrate;

forming a first insulating film on the gate electrode material;

forming a trench extending from a surface of the first insulating film to a bottom of the gate electrode material;

depositing a second insulating film to fill the trench, and planarizing the second insulating film to form a first gate electrode formation dummy pattern;

forming a mask having a pattern corresponding to a second gate electrode wider than a first gate electrode on the first insulating film and first gate electrode formation dummy pattern;

patterning the first insulating film into a shape corresponding to the second gate electrode and exposing an upper portion of the first gate electrode formation dummy pattern in a region except for the second gate electrode by etching using the mask, and removing the mask;

depositing a third insulating film on surfaces of the first gate electrode formation dummy pattern, gate electrode, and first insulating film, and etching back the third insulating film to form first gate electrode formation sidewall patterns on side surfaces of the first gate electrode formation dummy pattern and on side surfaces of the first insulating film; and etching the gate electrode material by using the first gate electrode formation sidewall patterns as masks, thereby forming two gate electrodes which oppose each other.

10. A method according to claim 9, wherein the mask is formed, an anti-reflective film is formed on the surfaces of the first insulating film and the first gate electrode formation dummy pattern, a mask material is formed on a surface of the anti-reflective film, and the anti-reflective film and mask material are patterned to have a pattern corresponding to the predetermined active region.

11. A method according to claim 9, wherein after the mask is removed and before the third insulating film is deposited, wet etching is performed on the first insulating film having a pattern corresponding to the second gate electrode region, thereby decreasing a pattern width.

12. A method according to claim 9, wherein a silicon nitride film is used as the first insulating film, a silicon oxide film is used as the second insulating film, and a silicon nitride film is used as the third insulating film.

* * * * *